(12) United States Patent
Tsuchiya et al.

(10) Patent No.: US 9,505,950 B2
(45) Date of Patent: Nov. 29, 2016

(54) POLISHING COMPOSITION AND METHOD FOR PRODUCING SUBSTRATE

(71) Applicant: FUJIMI INCORPORATED, Kiyosu-shi, Aichi (JP)

(72) Inventors: Kohsuke Tsuchiya, Kiyosu (JP); Shuhei Takahashi, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 14/423,945

(22) PCT Filed: Aug. 12, 2013

(86) PCT No.: PCT/JP2013/071813
§ 371 (c)(1),
(2) Date: Feb. 25, 2015

(87) PCT Pub. No.: WO2014/034425
PCT Pub. Date: Mar. 6, 2014

(65) Prior Publication Data
US 2015/0210892 A1 Jul. 30, 2015

(30) Foreign Application Priority Data
Aug. 31, 2012 (JP) ................... 2012-191899

(51) Int. Cl.
| | | |
|---|---|---|
| *C08F 16/06* | (2006.01) | |
| *C08F 26/10* | (2006.01) | |
| *C09G 1/02* | (2006.01) | |
| *B24B 37/04* | (2012.01) | |
| *H01L 21/02* | (2006.01) | |
| *C09K 3/14* | (2006.01) | |
| *C09G 1/16* | (2006.01) | |
| *C08B 11/08* | (2006.01) | |
| *C08G 81/00* | (2006.01) | |

(52) U.S. Cl.
CPC .............. *C09G 1/02* (2013.01); *B24B 37/044* (2013.01); *C08B 11/08* (2013.01); *C08F 16/06* (2013.01); *C08F 26/10* (2013.01); *C08G 81/00* (2013.01); *C09G 1/16* (2013.01); *C09K 3/1436* (2013.01); *C09K 3/1463* (2013.01); *H01L 21/02024* (2013.01); *Y02P 20/582* (2015.11)

(58) Field of Classification Search
CPC ........ B24B 37/044; C09G 1/02; C09G 1/04; C09G 1/16; C09K 3/1463; H01L 21/304; H01L 21/02024
See application file for complete search history.

(56) References Cited

U.S. PATENT DOCUMENTS

| | | | |
|---|---|---|---|
| 6,685,757 B2 * | 2/2004 | Xu et al. | 51/308 |
| 2003/0154659 A1 | 8/2003 | Xu et al. | |
| 2004/0147206 A1 | 7/2004 | Akahori et al. | |
| 2006/0110924 A1 | 5/2006 | Ghosh et al. | |
| 2009/0032006 A1 | 2/2009 | Nam et al. | |
| 2009/0126713 A1 | 5/2009 | Grumbine et al. | |
| 2010/0301014 A1 | 12/2010 | Mizuno et al. | |
| 2011/0073800 A1 | 3/2011 | Wang et al. | |

FOREIGN PATENT DOCUMENTS

| | | | |
|---|---|---|---|
| CN | 100362068 C | 1/2008 | |
| CN | 100446926 C | 12/2008 | |
| CN | 102031065 A | 4/2011 | |
| CN | 102084465 A | 6/2011 | |
| CN | 102257092 A | 11/2011 | |
| JP | 2001-240850 A | 9/2001 | |
| JP | 2003-303791 A | 10/2003 | |
| JP | 2003-303792 A | 10/2003 | |
| JP | 2003303791 A | * 10/2003 | |
| JP | 2005-123650 A | 5/2005 | |
| JP | 2006-165541 A | 2/2006 | |
| JP | 2006352042 | * 12/2006 | ........... H01L 21/304 |
| JP | 2012-079964 A | 4/2012 | |
| WO | WO 03/072669 A2 | 9/2003 | |
| WO | WO 2009/096495 A1 | 8/2009 | |

* cited by examiner

*Primary Examiner* — Alexa Neckel
*Assistant Examiner* — Marie Reddick
(74) *Attorney, Agent, or Firm* — Foley & Lardner LLP

(57) ABSTRACT

A polishing composition includes a water-soluble polymer having a weight average molecular weight of 1000000 or less and a molecular weight distribution represented by weight average molecular weight (Mw)/number average molecular weight (Mn) that is less than 5.0. The polishing composition is mainly used in an application for polishing a substrate, preferably in an application for performing final polishing on a substrate.

12 Claims, No Drawings

POLISHING COMPOSITION AND METHOD FOR PRODUCING SUBSTRATE

TECHNICAL FIELD

The present invention relates to a polishing composition and a method for manufacturing a substrate using the same.

BACKGROUND ART

A polishing composition containing a water-soluble polymer is used for polishing a substrate such as a silicon substrate. The water-soluble polymer functions to enhance the wettability of the substrate surface. This reduces residual foreign matter on the substrate surface. Patent Document 1 discloses a polishing composition containing a water-soluble polymer or the like that increases the polishing speed and reduces the haze level.

PRIOR ART DOCUMENTS

Patent Documents

Patent Document 1: International Publication No. WO 2003/072669

SUMMARY OF THE INVENTION

Problems to be Solved by the Invention

Surface defects referred to as light point defects (LPDs) may occur on the substrate surface polished by a polishing composition. The present invention is based on the observation that the weight average molecular weight and the molecular weight distribution represented by weight average molecular weight (Mw)/number average molecular weight (Mn) of the water-soluble polymer contained in the polishing composition are correlated with the reduction level of the LPDs. Patent Document 1 does not refer to such a correlation.

It is an object of the present invention to provide a polishing composition and a method for manufacturing a substrate that easily reduce LPDs on a polished surface. The phrase "reduce LPDs" means reducing the number or size of the LPDs.

Means for Solving the Problems

To achieve the above object, a polishing composition according to the present invention includes a water-soluble polymer having a weight average molecular weight of 1000000 or less and a molecular weight distribution represented by weight average molecular weight (Mw)/number average molecular weight (Mn) that is less than 5.0.

Preferably, the water-soluble polymer includes at least one selected from a cellulose derivative, a starch derivative, polyvinyl alcohol, a polymer having a polyvinyl alcohol structure, a polymer having a polyoxyalkylene structure, and a polymer having a nitrogen atom in a main chain or side chain functional group thereof.

Preferably, the water-soluble polymer includes at least one selected from a cellulose derivative, a starch derivative, polyvinyl alcohol, and a polymer having a polyvinyl alcohol structure, and at least one selected from a polymer having a polyoxyalkylene structure and a polymer having a nitrogen atom in the main chain or side chain functional group thereof.

Preferably, the polishing composition is used in an application for polishing a substrate.

Preferably, the polishing composition is used in an application for performing final polishing on a substrate.

Preferably, a method for manufacturing a substrate according to the present invention includes a polishing step for polishing a substrate using the above polishing composition.

Effects of the Invention

The present invention easily reduces LPDs on a polished surface.

EMBODIMENTS OF THE INVENTION

Embodiments of the present invention will now be described. The present invention is not limited to the embodiments described below and design changes are possible as long as the contents of the invention are not adversely affected.

The polishing composition comprises a water-soluble polymer having a weight average molecular weight of 1000000 or less and a molecular weight distribution represented by weight average molecular weight (Mw)/number average molecular weight (Mn) that is less than 5.0. The polishing composition of the present embodiment is used in an application for polishing a substrate such as a silicon substrate or a compound semiconductor substrate. A process for polishing a substrate includes, for example, pre-polishing (e.g., primary polishing or secondary polishing), which flattens the surface of a disk-shaped substrate sliced from a monocrystal ingot, and final polishing, which removes fine irregularities from the substrate surface after the pre-polishing to mirror-finish the surface. The polishing composition is suitable for use in both the pre-polishing and the final polishing of the substrate. The polishing composition of the present embodiment is further suitable for use when finally polishing the substrate.

The polishing composition of the present embodiment can contain abrasive grains, a basic compound, and water as components other than the water-soluble polymer.

<Water-Soluble Polymer>

The water-soluble polymer functions to increase the wettability of the polished surface. Water-soluble polymer having a small molecular weight distribution easily reduces LPDs. As described above, the molecular weight distribution of the water-soluble polymer used in the polishing composition is less than 5.0, preferably 4.9 or less, further preferably 4.8 or less, and further preferably 4.7 or less, and most preferably 4.6 or less. The molecular weight distribution of the water-soluble polymer is theoretically 1.0 or greater. As the molecular weight distribution of the water-soluble polymer increases, the wettability of the polished surface increases.

The molecular weight distribution of the water-soluble polymer is also referred to as a polydispersity index (PDI). The weight average molecular weight (Mw) is presented in polyethylene oxide equivalent. The values of the weight average molecular weight, the number average molecular weight, and the molecular weight distribution are obtained through measurements performed by gel permeation chromatography (GPC).

As the water-soluble polymer, those having at least one functional group selected from cationic, anionic, and nonionic groups in the molecule can be used. The water-soluble polymer has, for example, a hydroxyl group, a carboxyl group, an acyloxy group, a sulfo group, an amide structure, a quaternary nitrogen structure, a heterocyclic structure, a vinyl structure, or a polyoxyalkylene structure in the molecule.

Examples of the water-soluble polymer include, for example, a cellulose derivative such as hydroxyethyl cellulose, a starch derivative such as pullulan or cyclodextrin, an imine derivative such as poly(N-acylalkyleneimine), polyvinyl alcohol, a copolymer containing polyvinyl alcohol as a portion of its structure, polyvinylpyrrolidone, a copolymer containing polyvinylpyrrolidone as a portion of its structure, polyvinyl caprolactam, a copolymer containing polyvinyl caprolactam as a portion of its structure, polyalkylacrylamide, polyacryloylmorpholine, a copolymer containing polyacryloylmorpholine as a portion of its structure, polyoxyethylene, a polymer having a polyoxyalkylene structure, and a polymer having a plurality of these structures in the form of di-block, tri-block, random or alternating type.

The processes for obtaining the water-soluble polymer having a small molecular weight distribution (Mw/Mn) includes living anionic polymerization, living cationic polymerization, and living radical polymerization. The living radical polymerization process is suitable since various types of monomers can be polymerized and fewer restrictions are imposed on the industrial process.

Examples of the living radical polymerization process include a polymerization process using a nitroxide compound, an atom-transfer radical polymerization process, and a polymerization process using a chain transfer agent (RAFT agent) such as a dithioester compound.

Monomers applicable to the living radical polymerization process include, for example, (meth)acrylates, styrene derivatives, acrylamide derivatives including cyclic amides, vinyl acetate, olefins, and various functional monomers containing a hydroxyl group, an alkoxysilyl group, an amino group, an epoxy group or the like. Any of water-soluble (hydrophilic) polymers obtained by using one or more of these monomers may be subject to the present invention.

The water-soluble polymers may be used singly or in combinations of two or more.

When at least one water-soluble polymer selected from cellulose derivatives and starch derivatives (hereinafter, referred to as "water-soluble polymer A") is used as the water-soluble polymer, the molecular weight distribution of the water-soluble polymer A is preferably 4.7 or less, and further preferably 4.5 or less. The molecular weight distribution of the water-soluble polymer A is preferably 2.0 or greater, further preferably 3.0 or greater, and even further preferably 4.0 or greater from the viewpoint of increasing the wettability.

When a polymer having a polyoxyalkylene structure (hereinafter, referred to as "water-soluble polymer B") is used as the water-soluble polymer, the molecular weight distribution of the water-soluble polymer B is preferably 2.0 or less, and further preferably 1.5 or less. The molecular weight distribution of the water-soluble polymer B is preferably 1.05 or greater.

When at least one water-soluble polymer selected from polyvinyl alcohol and a polymer having a polyvinyl alcohol structure (hereinafter, referred to as "water-soluble polymer C") is used as the water-soluble polymer, the molecular weight distribution of the water-soluble polymer C is preferably 3.0 or less, further preferably 2.5 or less, and even further preferably 2.3 or less. The molecular weight distribution of the water-soluble polymer C is preferably 1.05 or greater, and preferably 1.3 or greater from the viewpoint of increasing the wettability and enabling easy synthesis.

When the polymer having a nitrogen atom in the main chain or side chain functional group (pendant group) thereof (hereinafter, referred to as "water-soluble polymer D") is used as the water-soluble polymer, the molecular weight distribution of the water-soluble polymer D is preferably 4.0 or less, further preferably 3.5 or less, and even further preferably 3.0 or less. The molecular weight distribution of the water-soluble polymer D is preferably 1.05 or greater, and preferably 1.3 or greater from the viewpoint of increasing the wettability and enabling easy synthesis.

The weight average molecular weight of the water-soluble polymer is 1000000 or less. This easily reduces the LPDs. A decrease in the weight average molecular weight of the water-soluble polymer increases the stability of the polishing composition. An increase in the weight average molecular weight of the water-soluble polymer increases the wettability of the polished surface.

The weight average molecular weight of the water-soluble polymer A is preferably 750000 or less, further preferably 700000 or less, even further preferably 500000 or less, and most preferably 300000 or less. The weight average molecular weight of the water-soluble polymer A is preferably 50000 or greater, further preferably 80000 or greater, and even further preferably 100000 or greater.

The weight average molecular weight of the water-soluble polymer B is preferably 500000 or less, further preferably 300000 or less, and even further preferably 250000 or less (for example, 100000 or less). The weight average molecular weight of the water-soluble polymer B is preferably 1000 or greater, further preferably 2000 or greater, and even further preferably 5000 or greater (for example, 10000 or greater).

The weight average molecular weight of the water-soluble polymer C is preferably 300000 or less, further preferably 250000 or less, even further preferably 200000 or less, and most preferably 100000 or less (for example, 50000 or less, further 20000 or less). The weight average molecular weight of the water-soluble polymer C is preferably 1000 or greater, further preferably 2000 or greater, and even further preferably 5000 or greater (for example, 7000 or greater).

The weight average molecular weight of the water-soluble polymer D is preferably 300000 or less, further preferably 250000 or less, and even further preferably 200000 or less (for example, 100000 or less, further 70000 or less). The weight average molecular weight of the water-soluble polymer D is preferably 1000 or greater, further preferably 3000 or greater, even further preferably 5000 or greater, and most preferably 10000 or greater (for example, 20000 or greater, further 30000 or greater).

From the viewpoint of reduction of the LPDs, preferably, the polishing composition includes at least one selected from the water-soluble polymers A and C, and further preferably, includes at least one selected from the water-soluble polymers A and C and at least one selected from the water-soluble polymers B and D.

Examples of the water-soluble polymer A include, for example, a cellulose derivative such as hydroxyethyl cellulose, hydroxypropyl cellulose, hydroxyethylmethyl cellulose, hydroxypropylmethyl cellulose, methyl cellulose, ethyl cellulose, ethylhydroxyethyl cellulose or carboxymethyl cellulose, and a starch derivative such as pullulan or cyclodextrin. Among the cellulose derivatives and the starch derivatives, hydroxyethyl cellulose is particularly preferred from the viewpoint of having high ability for applying wettability to the polished surface and being easy to remove during the washing step after polishing (i.e., good washing property).

The water-soluble polymer B is preferably a polymer having a block structure including an oxyethylene block and an oxypropylene block, further preferably a polymer having a tri-block structure including an oxyethylene block, an oxypropylene block, and an oxyethylene block, and even further preferably a polymer represented by the following general expression (1):

$$HO\text{-}(EO)_a\text{-}(PO)_b\text{-}(EO)_c\text{-}H \qquad (1)$$

In expression (1), EO represents an oxyethylene group, PO represents an oxypropylene group, and a, b and c each express an integer of 1 or greater.

In the general expression (1), a and c express the polymerization degrees of EO, and the sum of a and c is preferably in the range from 2 to 1000, further preferably from 5 to 500, and even further preferably from 10 to 200. In the general expression (1), b expresses the polymerization degree of PO and is preferably in the range from 2 to 200, further preferably from 5 to 100, and even further preferably from 10 to 50.

Examples of the water-soluble polymer C include polyvinyl alcohol and a polymer containing at least a vinyl alcohol unit. A polymer containing at least a vinyl alcohol unit and a vinyl acetate unit, for example, can be used as the polymer containing at least a vinyl alcohol unit. An example of the water-soluble polymer C includes a water-soluble polymer formed by partially saponifying a homopolymer or a copolymer of vinyl acetate. The partially saponified polyvinyl alcohol, which is formed by partially saponifying a homopolymer of vinyl acetate, is preferably used. The partially saponified polyvinyl alcohol is a water-soluble polymer composed of a vinyl alcohol unit and a vinyl acetate unit, and its saponification degree is preferably 50 mol % or greater, further preferably 60 mol % or greater, for example 65 mol % or greater, further preferably 70 mol % or greater, and even further preferably 80 mol % or greater. The saponification degree of the polyvinyl alcohol is theoretically 100% or less. In addition, when the copolymer having a polyvinyl alcohol structure is used as the water-soluble polymer C, the component percentage (molar percentage) of the vinyl alcohol unit constituting the copolymer is preferably 65 mol % or greater, and further preferably 75 mol %. As used herein, "copolymer" is a generic term including various copolymers such as random copolymers, alternating copolymers, block copolymer and graft copolymers unless otherwise noted.

As the water-soluble polymer D, a polymer containing a nitrogen atom in the main chain and a polymer having a nitrogen atom in the side chain functional group (pendant group) may each be used.

Examples of the polymer containing a nitrogen atom in the main chain include a homopolymer and a copolymer of N-acylalkyleneimine type monomer. Specific examples of the N-acylalkyleneimine type monomer include N-acetylethyleneimine, N-propionylethyleneimine, N-caproylethyleneimine, N-benzoylethyleneimine, N-acetylpropyleneimine, N-butyrylethyleneimine and the like. The homopolymer of the N-acylalkyleneimine type monomer includes poly(N-acetylethyleneimine), poly(N-propionylethyleneimine), poly(N-caproylethyleneimine), poly(N-benzoylethyleneimine), poly(N-acetylpropyleneimine), poly(N-butyrylethyleneimine) and the like. Examples of the copolymer of the N-acylalkyleneimine type monomer include copolymers of two or more of the N-acylalkyleneimine type monomers and copolymers of one or more of the N-acylalkyleneimine type monomers and another monomer.

The polymer having a nitrogen atom in the pendant group includes, for example, polymers containing a monomer unit of N-(meth)acryloyl type, polymers containing a monomer unit of N-vinyl type, and the like. Here, "(meth)acryloyl" is a generic term referring to acryl and methacryl.

Examples of a polymer containing a monomer unit of the N-(meth)acryloyl type include homopolymers and copolymers of the N-(meth)acryloyl type monomers (typically, copolymers having more than 50% by mass of the N-(meth) acryloyl type monomers). Examples of the N-(meth)acryloyl type monomer include chain amides having an N-(meth) acryloyl group and cyclic amides having an N-(meth)acryloyl group.

Examples of a chain amide having an N-(meth)acryloyl group include (meth)acrylamide; N-alkyl(meth)acrylamides such as N-methyl(meth)acrylamide, N-ethyl(meth)acrylamide, N-propyl(meth)acrylamide, N-isopropyl(meth)acrylamide, and N-n-butyl(meth)acrylamide; and N,N-dialkyl(meth) acrylamides such as N,N-dimethyl(meth)acrylamide, N,N-diethyl(meth)acrylamide, N,N-dipropyl(meth)acrylamide, N,N-diisopropyl(meth)acrylamide, N,N-di(n-butyl)(meth) acrylamide. Examples of a polymer containing a chain amide having an N-(meth)acryloyl group as a monomer unit include a homopolymer of N-isopropylacrylamide and copolymers of N-isopropylacrylamide (e.g., copolymers having more than 50% by mass of N-isopropylacrylamide).

Examples of a cyclic amide having an N-(meth)acryloyl group include N-(meth)acryloylmorpholine, N-(meth)acryloylpyrrolidine and the like. Examples of a polymer containing a cyclic amide having an N-(meth)acryloyl group as a monomer unit include a homopolymer of N-acryloylmorpholine and copolymers of N-acryloylmorpholine (e.g., copolymers having more than 50% by mass of N-acryloylmorpholine).

Examples of a polymer containing a monomer unit of the N-vinyl type include homopolymers and copolymers of N-vinyl lactam type monomers (e.g., copolymers having more than 50% by mass of the N-vinyl lactam type monomer) and homopolymers and copolymers of N-vinyl chain amides (e.g., copolymers having more than 50% by mass of the N-vinyl chain amide).

Specific examples of an N-vinyl lactam type monomer include N-vinylpyrrolidone (VP), N-vinylpiperidone, N-vinylmorpholinone, N-vinylcaprolactam (VC), N-vinyl-1,3-oxazin-2-one, N-vinyl-3,5-morpholinedione and the like. Specific examples of a polymer containing a monomer unit of the N-vinyl lactam type include polyvinylpyrrolidone (PVP), polyvinyl caprolactam, a random copolymer of VP and VC, random copolymers of one or both of VP and VC and another vinyl monomer (e.g., an acrylic monomer, a vinyl ester monomer or the like), block copolymers and graft copolymers containing a polymer segment containing one or both of VP and VC (e.g., a graft copolymer of polyvinyl alcohol grafted with polyvinylpyrrolidone).

Specific examples of the N-vinyl chain amide include N-vinylacetamide, N-vinylpropionamide, N-vinylbutyramide and the like.

Other examples of a polymer having a nitrogen atom in the pendant group include a homopolymer and a copolymer of a vinyl monomer (e.g., a monomer having a (meth) acryloyl group) having an amino group, such as aminoethyl (meth)acrylate, N,N-dimethylaminoethyl (meth)acrylate and N,N-dimethylaminopropyl (meth)acrylate.

When the polishing composition includes the water-soluble polymer A and at least one selected from the water-soluble polymers B and D, from the viewpoint of reduction of the LPDs, the polishing composition, most preferably, includes hydroxyethyl cellulose and at least one selected from the polymers represented by the above-described general expression (1), polyvinylpyrrolidone, polyalkylacrylamides, and polyacryloylmorpholine.

When the polishing composition includes the water-soluble polymer C and at least one selected from the water-soluble polymers B and D, from the viewpoint of reduction of the LPDs, the polishing composition, most preferably, includes polyvinyl alcohol or a partially saponified polyvinyl alcohol and at least one selected from the polymers represented by the above-described general expression (1), polyvinylpyrrolidone, polyalkylacrylamides, and polyacryloylmorpholine.

Preferably, the content of the water-soluble polymer in the polishing composition is 0.002% by mass or greater, further preferably 0.004% by mass or greater, even further preferably 0.006% by mass or greater, and most preferably 0.01% by mass or greater. An increase in the content of the water-soluble polymer in the polishing composition increases the wettability of the polished surface. Preferably, the content of the water-soluble polymer in the polishing composition is 0.5% by mass or less, further preferably 0.2% by mass or less, even further preferably 0.1% by mass or less, and most preferably 0.05% by mass or less. A decrease in the content of the water-soluble polymer in the polishing composition increases the stability of the polishing composition.

<Abrasive Grains>

The polishing composition may include abrasive grains. The abrasive grains function to physically polish the polishing surface.

The abrasive grains may be, for example, inorganic grains, organic grains, and organic-inorganic composite grains. The inorganic grains may be, for example, grains consisting of metal oxides, such as silica, alumina, ceria, and titania, and silicon nitride grains, silicon carbide grains, and boron nitride grains. The organic grains may be, for example, a polymethylmethacrylate (PMMA) grains.

Preferably, the mean primary grain diameter of the abrasive grains is 5 nm or greater, further preferably 15 nm or greater, and even further preferably 25 nm or greater. An increase in the mean primary grain diameter of the abrasive grain obtains a higher polishing speed. Preferably, the mean primary grain diameter of the abrasive grains is 100 nm or less, further preferably 50 nm or less, and even further preferably 40 nm or less. A decrease in the mean primary grain diameter of the abrasive grains improves the stability of the polishing composition.

The value of the mean primary grain diameter of the abrasive grains is calculated, for example, based on the specific surface area measured through the BET method. The specific surface area of the abrasive grains can be measured using, for example, "Flow Sorb II 2300" (Micromeritics Instrument Corp.).

Preferably, the mean secondary grain diameter of the abrasive grains is 10 nm or greater, further preferably 30 nm or greater, and even further preferably 40 nm or greater. An increase in the mean secondary grain diameter of the abrasive grains obtains a higher polishing speed. The mean secondary grain diameter of the abrasive grain is preferably 200 nm or less, further preferably 100 nm or less, and even further preferably 80 nm or less. A decrease in the mean secondary grain diameter of the abrasive grains improves the stability of the polishing composition. The mean secondary grain diameter of the abrasive grains is measured using FPAR-1000 (Otsuka Electronics Co., Ltd.).

The mean value of the major axis/minor axis ratios of the abrasive grains is theoretically 1.0 or greater, preferably 1.05 or greater, and further preferably 1.1 or greater. An increase in the mean value of the major axis/minor axis ratios obtains a higher polishing speed. Preferably, the mean value of the major axis/minor axis ratios of the abrasive grains is 3.0 or less, further preferably 2.0 or less, and even further preferably 1.5 or less. A decrease in the mean value of the major axis/minor axis ratios reduces scratches formed on the polished surface.

Preferably, the number of the abrasive grains having the above-described major axis/minor axis ratios of 1.5 or greater accounts for 10% or greater of the total number of the abrasive grain grains contained in the polishing composition, and further preferably 20% or greater. An increase in the percentage of the grains having the major axis/minor axis ratios of 1.5 or greater easily reduces the LPDs. In addition, an increase in the percentage of the grains having the major axis/minor axis ratios of 1.5 or greater obtains a higher polishing speed. Preferably, the percentage of the grains having the major axis/minor axis ratios of 1.5 or greater is 90% or less, and further preferably 80% or less. A decrease in the percentage of the grains having the major axis/minor axis ratios of 1.5 or greater easily reduces the haze level of the polished surface.

The above-described major axis/minor axis ratio is a value related to the shape of the abrasive grain and can be obtained using, for example, using an electron microscope image of the abrasive grain. Specifically, a minimum circumscribed rectangle is illustrated for each abrasive grain in a scanning electron microscope image of a predetermined number of abrasive grains (e.g., 200 grains). Subsequently, for each minimum circumscribed rectangle, the length of the long side (major axis value) is divided by the length of the short side (minor axis value) to calculate the value of the major axis/minor axis ratio. Then, a mean value of the values is calculated to obtain the mean value of the major axis/minor axis ratios. The calculation of the above-described major axis/minor axis ratios can be performed based on images obtained using a scanning electron microscope, for example, "S-4700" (Hitachi Ltd.).

Preferably, the abrasive grain content in the polishing composition is 0.05% by mass or greater, further preferably 0.1% by mass or greater, and even further preferably 0.2% by mass or greater. An increase in the abrasive grain content obtains a higher polishing speed. Preferably, the abrasive grain content in the polishing composition is 10% by mass or less, further preferably 3% by mass or less, even further preferably 1% by mass or less. A decrease in the abrasive grain content improves the stability of the polishing composition.

Silica, serving as the abrasive grains, is suitably used for polishing, for example, a silicon substrate. Specific examples of the silica include colloidal silica, fumed silica, and sol-gel silica. Among such silicas, colloidal silica and fumed silica are preferred from the viewpoint of reduction of scratches formed on the polished surface, and colloidal silica is particularly preferred. The silicas may be used singly or in combinations of two or more.

Preferably, the true specific gravity of the silica is 1.5 or greater, further preferably 1.6 or greater, and even further preferably 1.7 or greater. An increase in the true specific gravity of the silica obtains a higher polishing speed. Preferably, the true specific gravity of the silica is 2.2 or less, further preferably 2.0 or less, and even further preferably 1.9 or less. A decrease in the true specific gravity of the silica reduces the scratches formed on the polished surface. The true specific gravity of the silica is calculated from the weight of dried silica grains and the total weight of the silica grains immersed in ethanol of a known volume.

<Basic Compound>

The polishing composition may include a basic compound. The basic compound functions to chemically polish (chemical etching) the polishing surface. This easily increases the polishing speed.

The basic compound includes, for example, a hydroxides of an alkali metal, a quaternary ammonium hydroxide or a salt thereof, ammonia, and an amine. The hydroxide of an alkali metal includes, for example, potassium hydroxide and sodium hydroxide. The quaternary ammonium hydroxide or a salt thereof includes, for example, tetramethylammonium hydroxide, tetraethylammonium hydroxide, and tetrabutylammonium hydroxide. The amine includes, for example, methylamine, dimethylamine, trimethylamine, ethylamine, diethylamine, triethylamine, ethylenediamine, monoethanolamine, N-(β-aminoethyl)ethanolamine, hexamethylenediamine, diethylenetriamine, triethylenetetramine, anhydrous piperazine, piperazine hexahydrate, 1-(2-aminoethyl)piperazine, N-methylpiperazine, and guanidine.

The basic compounds may be used singly or in combinations of two or more.

Among basic compounds, at least one selected from ammonia, an alkali metal hydroxide, and a quaternary ammonium hydroxide is preferred.

Among basic compounds, at least one selected from ammonia, potassium hydroxide, sodium hydroxide, tetramethylammonium hydroxide, and tetraethylammonium hydroxide is further preferred, at least one of ammonia and tetramethylammonium hydroxide is even further preferred, and ammonia is the most preferred.

Preferably, the content of the basic compound in the polishing composition is 0.001% by mass or greater, further preferably 0.002% by mass or greater, even further preferably 0.003% by mass or greater, and most preferably 0.005% by mass or greater. An increase in the content of the basic compound obtains a higher polishing speed. Preferably, the content of the basic compound in the polishing composition is 1.0% by mass or less, further preferably 0.5% by mass or less, even further preferably 0.1% by mass or less, and most preferably 0.05% by mass or less. A decrease in the content of the basic compound in the polishing composition reduces the roughness of the polished surface and easily maintains the shape of the substrate.

<Water>

The water in the polishing composition functions to dissolve or disperse other components. It is preferred that the water does not inhibit the functions of other components contained in the polishing composition. Examples of such water include, for example, water having a total content of transition metal ions of not more than 100 ppb. The purity of the water can be enhanced by, for example, removal of impurity ions using an ion exchange resin, removal of foreign matter with a filter, distillation, or the like. Specifically, the use of, for example, deionized water, pure water, super-pure water, or distilled water is preferred.

<pH>

Preferably, the pH of the polishing composition is 8.0 or greater, further preferably 8.5 or greater, and even further preferably 9.0 or greater. An increase in the pH of the polishing composition obtains a higher polishing speed. Preferably, the pH of the polishing composition is 12.5 or less, further preferably 11.5 or less, and most preferably 11 or less. A decrease in the pH of the polishing composition reduces the roughness of the polished surface and easily maintains the shape of the substrate.

<Chelating Agent>

The polishing composition may include a chelating agent. The chelating agent captures metal impurities in the polishing system to form complexes. This reduces the residual level of metal impurities on the substrate. The metal impurities in the polishing system include, for example, impurities derived from the raw materials for the polishing composition, impurities generated from the polishing surface or the polishing apparatus during polishing, and contaminants from the ambient environment. Particularly, when the substrate is a semiconductor substrate, reduction in the residual level of the metal impurities prevents metallic contamination of the semiconductor substrate and limits deterioration in the quality of the semiconductor substrate.

The chelating agent includes, for example, an aminocarboxylic acid-based chelating agent and an organic phosphonic acid-based chelating agent. The aminocarboxylic acid-based chelating agent includes, for example, ethylenediaminetetraacetic acid, sodium ethylenediaminetetraacetate, nitrilotriacetic acid, sodium nitrilotriacetate, ammonium nitrilotriacetate, hydroxyethylethylenediaminetriacetic acid, sodium hydroxyethylethylenediaminetriacetate, diethylenetriaminepentaacetic acid, sodium diethylenetriaminepentaacetate, triethylenetetraminehexaacetic acid, and sodium triethylenetetraminehexaacetate. The organic phosphonic acid-based chelating agent includes, for example, 2-aminoethylphosphonic acid, 1-hydroxyethylidene-1,1-diphosphonic acid, aminotri(methylenephosphonic acid), ethylenediaminetetrakis(methylenephosphonic acid), diethylenetriaminepenta(methylenephosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxyphosphonic acid, 2-phosphonobutane-1,2-dicarboxylic acid, 1-phosphonobutane-2,3,4-tricarboxylic acid, and α-methylphosphonosuccinic acid.

<Surfactant>

The polishing composition may include a surfactant. The surfactant reduces the roughness of the polished surface. This easily reduces the haze level of the polished surface. Particularly, when the polishing composition contains the basic compound, the polished surface tends to be rough due to the chemical etching with the basic compound. Therefore, the use of the basic compound together with the surfactant is particularly effective.

The surfactant preferably has a weight average molecular weight that is less than 1000 and includes anionic and nonionic surfactants. Among such surfactants, the nonionic surfactant is suitably used. The nonionic surfactant is easy to handle when preparing or using the polishing composition due to low foaming. In addition, when the nonionic surfactant is used, the pH of the polishing composition is easily adjusted.

The nonionic surfactant includes, for example, an oxyalkylene polymer such as polyethylene glycol and polypropylene glycol; a polyoxyalkylene adduct such as polyoxyethylene alkyl ether, polyoxyethylene alkyl phenyl ether, polyoxyethylene alkylamine, polyoxyethylene fatty acid ester, polyoxyethylene glyceryl ether fatty acid ester, polyoxyethylene sorbitan fatty acid ester; and a copolymer of a plurality of oxyalkylenes (diblock-type, triblock-type, random-type, alternating-type).

Specifically, the nonionic surfactant includes a polyoxyethylene polyoxypropylene copolymer, polyoxyethylene glycol, polyoxyethylene propyl ether, polyoxyethylene butyl ether, polyoxyethylene pentyl ether, polyoxyethylene hexyl ether, polyoxyethylene octyl ether, polyoxyethylene 2-ethylhexyl ether, polyoxyethylene nonyl ether, polyoxyethylene decyl ether, polyoxyethylene isodecyl ether, polyoxyethylene tridecyl ether, polyoxyethylene lauryl ether, polyoxyethylene cetyl ether, polyoxyethylene stearyl ethers, polyoxyethylene isostearyl ether, polyoxyethylene oleyl ether, polyoxyethylene phenyl ether, polyoxyethylene octyl phenyl ether, polyoxyethylene nonyl phenyl ether, polyoxyethylene dodecyl phenyl ether, polyoxyethylene styrenated phenyl ether, polyoxyethylene lauryl amine, polyoxyethylene stearyl amine, polyoxyethylene oleyl amine, polyoxyethylene stearyl amide, polyoxyethylene oleyl amide, polyoxyethylene monolaurate, polyoxyethylene monostearate, polyoxyethylene distearate, polyoxyethylene monooleate, polyoxyethylene dioleate, polyoxyethylene sorbitan monolaurate, polyoxyethylene sorbitan monopalmitate, polyoxyethylene sorbitan monostearate, polyoxyethylene sorbitan monooleate, polyoxyethylene sorbitan trioleate, tetraoleic acid polyoxyethylene sorbitol, polyoxyethylene castor oil, polyoxyethylene hydrogenated castor oil, and the like. Among these surfactants, a polyoxyethylene alkyl ether, particularly polyoxyethylene decyl ether is suitably used.

The surfactants may be used singly or in combinations of two or more.

<Other Components>

The polishing composition may further include, when necessary, known additives commonly contained in polishing compositions, for example, an organic acid, an organic acid salt, an inorganic acid, an inorganic acid salt, a preservative, or an antifungal agent.

The organic acid includes, for example, a fatty acid such as formic acid, acetic acid and propionic acid; aromatic carboxylic acids such as benzoic acid and phthalic acid; citric acid; oxalic acid; tartaric acid; malic acid; maleic acid; fumaric acid; succinic acid; organic sulfonic acids; and organic phosphonic acids. The organic acid salt includes, for example, an alkali metal salt (e.g., sodium salt and potassium salt) or an ammonium salt of an organic acid.

The inorganic acid includes, for example, sulfuric acid, nitric acid, hydrochloric acid, and carbonic acid. The inorganic acid salt includes, for example, an alkali metal salt (e.g., sodium salt and potassium salt) or an ammonium salt of an inorganic acid.

The organic acids and its salts as well as the inorganic acids and its salts may each be used singly or in combinations of two or more.

The preservatives and antifungal agents include, for example, an isothiazoline-based compound, p-oxybenzoate, and phenoxyethanol.

<Preparation of the Polishing Composition>

The polishing composition can be prepared by using a known mixing apparatus, for example, a propeller agitator, a supersonic disperser or a homomixer. The components for the polishing composition may be mixed simultaneously or mixed in any order.

Preferably, the polishing composition is obtained through a diluting step for diluting a stock solution of the polishing composition with water from the viewpoint of facilitating transportation and storage. That is, it is preferred that a stock solution containing the water-soluble polymer be prepared in advance and the stock solution be diluted to obtain the polishing composition.

The polishing composition of the present embodiment can be also obtained from a stock solution containing abrasive grains and the water-soluble polymer having the above-described weight average molecular weight and molecular weight distribution. Even in this case, the LPDs are easily reduced based on the weight average molecular weight and the molecular weight distribution of the water-soluble polymer.

When the stock solution contains abrasive grains and the water-soluble polymer having the above-described weight average molecular weight and molecular weight distribution, the grains in the polishing composition prepared through the diluting step have suitable dispersibility. The grains include single bodies of abrasive grains and an agglomerate of the abrasive grains and the water-soluble polymer. The dispersibility of the grains in the polishing composition can be evaluated based on the measured value for the volume average grain diameter of the grains contained in the polishing composition. The volume average grain diameter can be obtained through, for example, a dynamic light scattering method using a grain diameter distribution measuring apparatus (model "UPA-UT151", Nikkiso Co., Ltd.). It is understood that the dispersibility of the grains in the polishing composition is important for reducing the LPDs. The above-described water-soluble polymer is also advantageous from the viewpoint of increasing the dispersibility of the grains. Further, the use of the water-soluble polymer described above further easily reduces the LPDs.

Preferably, the volume average grain diameter of the grains contained in the polishing composition obtained by diluting the stock solution is 10 nm or greater, further preferably 30 nm or greater, and even further preferably 40 nm or greater. An increase in the volume average grain diameter of the grains obtains a higher polishing speed. Preferably, the volume average grain diameter of the grains contained in the polishing composition obtained by diluting the stock solution is 200 nm or less, further preferably 100 nm or less, and even further preferably 80 nm or less. A decrease in the volume average grain diameter of the grains easily reduces the LPDs.

Preferably, the dilution rate D on a volume basis in the diluting step is two times or greater, further preferably five times or greater, and even further preferably 10 times or greater. An increase in the dilution rate D of the diluting step lowers the transportation cost of the stock solution for the polishing composition and reduces the space required for storing the stock solution.

Preferably, the dilution rate D on a volume basis in the diluting step is 100 times or less, further preferably 50 times or less, and even further preferably 40 times or less. A decrease in the dilution rate D of the diluting step easily ensures the stability of the stock solution and the polishing composition.

The stock solution of the polishing composition can be prepared using a known mixing apparatus, for example, a propeller agitator, a supersonic disperser, or a homomixer. The materials of the stock solution for the polishing composition may be mixed simultaneously or mixed in any order.

Preferably, the stock solution of the polishing composition is diluted by gradually adding water while agitating the stock solution with the above-described mixing apparatus in the diluting step. The stock solution of the polishing composition may be diluted by adding water to the stock solution before agitating the mixture with the above-described mixing apparatus in the diluting step.

A method for manufacturing a substrate will now be described together with the operation of the polishing composition.

A substrate is manufactured by a method including a polishing step that uses the polishing composition. In the polishing step, a polishing pad is pressed against the surface of the substrate. Further, the substrate and the polishing pad are rotated while feeding the polishing composition to the surface of the substrate. During polishing, it is presumed that a higher solubility or dispersibility of the water-soluble polymer is obtained since the polishing composition contains the water-soluble polymer having a weight average molecular weight of 1000000 or less and a molecular weight distribution less than 5.0. It is presumed that this easily reduces the LPDs detected on the polished surface of the semiconductor substrate. The substrate that has undergone the polishing process then undergoes the washing step for washing the substrate surface.

The embodiment described above in detail has the following advantages.

(1) The polishing composition enables easy reduction of the LPDs on the polished surface since it contains the water-soluble polymer having a weight average molecular weight of 1000000 or less and a molecular weight distribution of less than 5.0.

(2) When prepared in the form of a stock solution containing abrasive grains and the water-soluble polymer, the polishing composition is easily stored and transported.

(3) When used in an application for polishing a substrate, the polishing composition can easily provide a substrate having reduced LPDs on the polished surface.

(4) The polishing composition is used for final polishing of a substrate. This contributes to quality improvement since the LPDs are reduced in the substrate after final polishing, which requires high quality.

(5) The method for manufacturing a substrate facilitates manufacturing of a substrate having reduced LPDs since the method includes the polishing step for polishing the substrate using the polishing composition containing the water-soluble polymer having a molecular weight distribution of less than 5.0.

The embodiment described above may be modified as follows:

The molecular weight distribution (Mw/Mn) of the water-soluble polymer in the polishing composition may be, for example, adjusted by mixing a plurality of water-soluble polymers having different weight average molecular weights. That is, when the water-soluble polymer in the polishing composition is composed of a plurality of water-soluble polymers, the molecular weight distribution (Mw/Mn) of the water-soluble polymers as a whole only needs to be less than 5.0.

The polishing composition may be of a one-pack-type or a multi-pack-type of two or more packs.

Each component contained in the polishing composition or stock solution may be filtered just before manufacturing. Further, the polishing composition that is used may be filtered before use. The filtering of the polishing composition removes coarse foreign matter from the polishing composition and improves the quality. The polishing composition contains the water-soluble polymer having a molecular weight distribution of less than 5.0. This reduces clogging of the filter used for the filtering and easily achieves satisfactory filtering.

The material and the structure of the filter used for the filtering described above are not particularly limited. The materials of the filter include, for example, cellulose, nylon, polysulfone, polyethersulfone, polypropylene, polytetrafluoroethylene (PTFE), polycarbonate, and glass. The structure of the filter includes, for example, a depth filter, a pleated filter and a membrane filter.

The polishing pad used in the polishing process using the polishing composition is not particularly limited. For example, any of a nonwoven cloth type, a suede type, those containing an abrasive grain, and those not containing an abrasive grain may be used.

When polishing a substrate using the polishing composition, the polishing composition once used for polishing may be recovered and reused to polish the substrate. The method for reusing the polishing composition include, for example, recovering the used polishing composition discharged from the polishing apparatus in a tank and then circulating the polishing composition again to the polishing apparatus from the tank. The reuse of the polishing composition reduces the discharged amount of the polishing composition that becomes waste liquid and decreases the consumption of the polishing composition. This is advantageous in that the load on the environment can be reduced and in that the cost for polishing the substrate can be lowered.

During reuse of the polishing composition, components such as the abrasive grains are consumed or lost during polishing. Therefore, the polishing compositing is preferably replenished by an amount corresponding to the decreased amount of the components such as the abrasive grains. The replenished components may be individually added to the polishing composition, or alternatively, added as a mixture containing two or more of the components in any concentration to the polishing composition depending on the tank capacity, polishing conditions or the like. By replenishing each of the components in the amount corresponding to the decrease in the reused polishing composition, the composition of the polishing composition is sustained so that the functions of the polishing composition are continuously maintained.

The material of a compound semiconductor substrate subject to polishing with the polishing composition includes silicon carbide, gallium nitride, gallium arsenide, and the like. The application of the polishing composition is not limited to polishing a semiconductor substrate. The polishing composition may also be applied to substrates formed from a metals such as stainless steel, a plastic, glass, sapphire, or the like, and in methods for manufacturing such substrates. Also in these cases, the LPDs on the polished surface can be easily reduced. In addition, the polishing composition can be also used for obtaining not only substrates but also polished products formed from any of various materials.

Technical concepts that can be recognized from the embodiments described above will now be described.

(a) A stock solution for dilution used to obtain a polishing composition, the stock solution comprising abrasive grains and a water-soluble polymer having a weight average molecular weight of 1000000 or less and a molecular weight distribution represented by weight average molecular weight (Mw)/number average molecular weight (Mn) that is less than 5.0.

(b) A method for manufacturing a polishing composition, the method comprising manufacturing the polishing composition through a diluting step for diluting the stock solution described above with water.

(c) A polishing method comprising polishing a substrate with the polishing composition.

EXAMPLES

The embodiment described above will be described further specifically using examples and comparative examples.

Examples 1 to 10 and Comparative Examples 1 to 6

A stock solution for each polishing composition was prepared by mixing colloidal silica serving as abrasive grains, one or more types of a water-soluble polymer, and a basic compound in deionized water. Then, each stock solution was filtered in order to remove coarse foreign matter from the stock solution. Colloidal silica having a mean primary grain diameter of 35 nm and ammonia were used as the abrasive grains and the basic compound, respectively. Subsequently, each stock solution was diluted by 20 times with pure water to obtain a polishing composition containing each water-soluble polymer set forth in Table 1. In the diluting step, a homogenizer was used to perform agitation and dispersion. Then, the polishing composition was filtered to remove coarse foreign matter.

In each example and each comparative example, the content of the abrasive grains in the polishing composition was 0.5% by mass and the content of the basic compound in the polishing composition was 0.01% by mass.

In the "Water-Soluble Polymer" column in Table 1, "Mw" represents the weight average molecular weight, "Mn" represents the number average molecular weight, "Mw/Mn" represents the molecular weight distribution, and the conditions for gel permeation chromatography (GPC) were as follows:

<GPC Conditions>
Column: TSKgel (Product Name) GMPW$_{XL}$×2+ G2500PW$_{XL}$ (7.8 mmΦ×300 mm×3) (Tosoh Corporation),
Column temperature: 40° C.,
Eluent: aqueous solution of 200 mM sodium nitrate,
Sample concentration: 0.05% by mass,
Flow rate: 1.0 mL/min,
Injection volume: 200 μL,
Detector: RI (differential refractometer),
Standard reference material: polyethylene oxide.

Under the "Water-Soluble Polymer" column in Table 1, "HEC" in the "Type" column represents hydroxyethyl cellulose, "PVP" represents polyvinylpyrrolidone, and "PEO-PPO-PEO" represents polyethylene oxide-polypropylene oxide-polyethylene oxide triblock copolymer. Here, "PEO-PPO-PEO" is a water-soluble polymer expressed by the general expression (1), in which the sum of a and c is 164 and in which b is 31. Further, "PVA1" represents polyvinyl alcohol having a saponification degree of 80 mol % and "PVA2" represents polyvinyl alcohol having a saponification degree of 98 mol % or greater.

<Polishing Step>

Final polishing was performed on a silicon substrate using the obtained polishing composition under the conditions set forth in Table 2. The silicon substrate subjected to the final polishing had been pre-polished using a commercially available polishing agent (GLANZOX-1103 (product name), Fujimi Incorporated). The silicon substrate had a diameter of 300 mm, a conduction type of P type, a crystal orientation of <100>, and a resistivity of 0.1 Ω·cm or greater and less than 100 Ω·cm.

<Washing Step>

Each silicon substrate after polishing was washed using a cleaning liquid of NH$_4$OH (29%):H$_2$O$_2$ (31%):deionized water (DIW)=1:3:30 (volume ratio) (SC-1 cleaning). More specifically, a first cleaning vessel, a second cleaning vessel, and a rinsing vessel were prepared, and each was equipped with an ultrasonic wave oscillator of frequency of 300 kHz. Each of the first and second cleaning vessels was filled with the above-described cleaning liquid and kept at 60° C. The rinsing vessel was filled with super-pure water. Each silicon substrate after polishing was immersed in the cleaning liquid in the first cleaning vessel and an ultrasonic wave was applied for 6 minutes. Subsequently, the silicon substrate was immersed in the super-pure water in the rinsing vessel and rinsed by applying an ultrasonic wave. Then, the silicon substrate was immersed in the cleaning liquid in the second cleaning vessel and an ultrasonic wave was applied for 6 minutes.

<Determination of LPDs>

The LPDs were determined by counting the number of the particles of 0.037 μm or greater in size on the surface of each silicon substrate after performing polishing with a wafer inspection apparatus (Surfscan SP2 (product name), KLA-Tencor Corporation). In the "LPD" column in Table 1, "A", "B", "C", "D", and "E" represent numbers of the particles that were less than 100, 100 or greater and less than 150, 150 or greater and less than 200, 200 or greater and less than 300, and 300 or greater, respectively.

<Determination of Haze Level>

The haze level of each silicon substrate was determined based on the measurement of the polished surface after the polishing process using a wafer inspection apparatus (Surfscan SP2 (product name), KLA-Tencor Corporation) in DWO mode of the apparatus. Cases in which the measured values were less than 0.110 ppm, 0.110 ppm or greater and less than 0.120 ppm, 0.120 ppm or greater and less than 0.130 ppm, 0.130 ppm or greater and less than 0.140 ppm, and 0.140 ppm or greater were determined as "A", "B", "C", "D", and "E", respectively. The determination results are shown in the "Haze" column in Table 1.

TABLE 1

| | Water-Soluble Polymer | | | | | | |
|---|---|---|---|---|---|---|---|
| | Mw | Mn | Mw/Mn | Type | Content [% by mass] | LPD | Haze |
| Example 1 | 250000 | 60000 | 4.2 | HEC | 0.01 | B | A |
| Example 2 | 500000 | 120000 | 4.2 | HEC | 0.01 | B | A |
| Example 3 | 750000 | 200000 | 3.8 | HEC | 0.01 | B | B |
| Example 4 | 250000 | 60000 | 4.2 | HEC | 0.01 | A | A |
| | 22000 | 8000 | 2.8 | PVP | 0.004 | | |
| Example 5 | 250000 | 60000 | 4.2 | HEC | 0.01 | A | A |
| | 10000 | 9000 | 1.1 | PEO-PPO-PEO | 0.003 | | |
| Example 6 | 100000 | 67000 | 1.5 | EOPO | 0.005 | B | A |

TABLE 1-continued

| | Mw | Mn | Mw/Mn | Type | Content [% by mass] | LPD | Haze |
|---|---|---|---|---|---|---|---|
| Example 7 | 60000 | 22000 | 2.7 | Random Copolymer PVA1 | 0.017 | A | A |
| Example 8 | 75000 | 22000 | 3.4 | Polyisopropylacrylamide | 0.008 | A | B |
| Example 9 | 78000 | 28000 | 2.8 | Polyacryloylmorpholine | 0.008 | A | B |
| Example 10 | 160000 | 47000 | 3.4 | Polyacryloylmorpholine | 0.007 | A | A |
| | 60000 | 20000 | 3.0 | PVA2 | 0.007 | | |
| Comparative Example 1 | 670000 | 90000 | 7.4 | HEC | 0.01 | E | B |
| Comparative Example 2 | 1050000 | 190000 | 5.5 | HEC | 0.01 | D | B |
| Comparative Example 3 | 1200000 | 200000 | 6.0 | HEC | 0.01 | D | D |
| Comparative Example 4 | 1100000 | 230000 | 4.8 | HEC | 0.01 | C | D |
| Comparative Example 5 | 1200000 | 260000 | 4.6 | HEC | 0.01 | C | D |
| Comparative Example 6 | 800000 | 90000 | 8.9 | EOPO Random Copolymer | 0.005 | E | B |

TABLE 2

Polishing Conditions

| | |
|---|---|
| Polishing Apparatus: | Sheet Polishing Machine (PNX-332B (Product Name), Okamoto Machine Tool Works, Ltd.) |
| Polishing Load: | 15 kPa |
| Platen Rotation Speed: | 30 rpm |
| Head Rotation Speed: | 30 rpm |
| Polishing Pad: | POLYPAS (Product Name) 27NX (Fujibo Holdings, Inc.) |
| Polishing Time: | 4 min |
| Polishing Composition Temperature: | 20° C. |
| Polishing Composition Feed Rate: | 500 ml/min (pouring onto the substrate) |

As shown in Table 1, the measurement result for the LPDs was A or B in each example. In comparative examples 1 and 6, the measurement results for the LPDs were inferior to that in each example since the molecular weight distributions of the water-soluble polymers used were 5.0 or greater. In comparative examples 2 and 3, the measurement results for the LPDs were inferior to that of each example since the weight average molecular weights of the water-soluble polymers used exceeded 1000000 and molecular weight distributions thereof were 5.0 or greater. In comparative examples 4 and 5, the measurement results for the LPDs were inferior to that of each example since the weight average molecular weights of the water-soluble polymers used exceeded 1000000 even though molecular weight distributions thereof were less than 5.0.

The invention claimed is:

1. A polishing composition comprising at least one water-soluble polymer selected from the group consisting of a cellulose derivative, a starch derivative, polyvinyl alcohol, a partially saponified vinyl acetate-based polymer, a block copolymer of polyoxyethylene and polyoxypropylene, and a nitrogen-containing polymer having a nitrogen atom in a main chain or in a side chain functional group, wherein:
   the cellulose derivative has a weight average molecular weight of 750000 or less and a molecular weight distribution represented by weight average molecular weight (Mw)/number average molecular weight (Mn) that is 4.7 or less, and is selected from the group consisting of hydroxyethyl cellulose, hydroxypropyl cellulose, hydroxyethylmethyl cellulose, hydroxypropylmethyl cellulose, methyl cellulose, ethyl cellulose, ethylhydroxyethyl cellulose, and carboxymethyl cellulose;
   the starch derivative has a weight average molecular weight of 750000 or less and a molecular weight distribution represented by weight average molecular weight (Mw)/number average molecular weight (Mn) that is 4.7 or less, and is selected from the group consisting of pullulan and cyclodextrin;
   the partially saponified vinyl acetate-based polymer is selected from the group consisting of a partially saponified homopolymer of vinyl acetate and a partially saponified copolymer of vinyl acetate; and
   the at least one water-soluble polymer other than the cellulose derivative and the starch derivative has a weight average molecular weight of 1000000 or less and a molecular weight distribution represented by weight average molecular weight (Mw)/number average molecular weight (Mn) that is less than 5.0.

2. The polishing composition according to claim 1, wherein the at least one water-soluble polymer includes at least one selected from the group consisting of the cellulose derivative and the starch derivative.

3. The polishing composition according to claim 1, wherein the at least one water-soluble polymer includes at least one selected from the group consisting of the polyvinyl alcohol and the partially saponified vinyl acetate-based polymer.

4. The polishing composition according to claim 1, wherein the at least one water-soluble polymer includes the block copolymer of polyoxyethylene and polyoxypropylene.

5. The polishing composition according to claim 1, wherein the at least one water-soluble polymer includes the nitrogen-containing polymer.

6. The polishing composition according to claim 1, wherein the at least one water-soluble polymer includes:
   at least one selected from the group consisting of the cellulose derivative, the starch derivative, the polyvinyl alcohol, and the partially saponified vinyl acetate-based polymer; and
   at least one selected from the group consisting of the block copolymer of polyoxyethylene and polyoxypropylene and the nitrogen-containing polymer.

7. The polishing composition according to claim 1 for use in an application for polishing a substrate.

8. The polishing composition according to claim 7 for use in an application for performing final polishing on a substrate.

9. A method for manufacturing a polished substrate comprising:
   providing a substrate; and
   polishing the substrate using the polishing composition according to claim 1.

10. The polishing composition according to claim 1, wherein the cellulose derivative, the starch derivative, the polyvinyl alcohol, the partially saponified vinyl acetate-based polymer, and the nitrogen-containing polymer each have a weight average molecular weight of 300000 or less.

11. The polishing composition according to claim 1, wherein the partially saponified vinyl acetate-based polymer is the partially saponified homopolymer of vinyl acetate.

12. The polishing composition according to claim 1, wherein the cellulose derivative and the starch derivative each have a molecular weight distribution represented by weight average molecular weight (Mw)/number average molecular weight (Mn) that is 4.5 or less.

* * * * *